US006719916B2

(12) United States Patent
Dubowski et al.

(10) Patent No.: US 6,719,916 B2
(45) Date of Patent: Apr. 13, 2004

(54) MULTILAYER MICROSTRUCTURES AND LASER BASED METHOD FOR PRECISION AND REDUCED DAMAGE PATTERNING OF SUCH STRUCTURES

(75) Inventors: Jan J. Dubowski, Ottawa (CA); Ye Tao, Ottawa (CA); Christophe Py, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 10/122,236

(22) Filed: Apr. 16, 2002

(65) Prior Publication Data

US 2003/0194882 A1 Oct. 16, 2003

Related U.S. Application Data

(60) Provisional application No. 60/284,197, filed on Apr. 18, 2001.

(51) Int. Cl.[7] .................. B44C 1/22; H01L 21/302; H01L 21/26

(52) U.S. Cl. .................. 216/65; 438/690; 438/795

(58) Field of Search .................. 438/795, 796, 438/797, 798, 799, 690; 216/2, 17, 65; 219/121.6, 121.7, 121.71

(56) References Cited

U.S. PATENT DOCUMENTS

| 4,490,211 A | | 12/1984 | Chen et al. .................. 156/643 |
| 4,879,449 A | * | 11/1989 | Duley et al. .................. 219/121.6 |
| 5,514,618 A | | 5/1996 | Hunter, Jr. et al. .................. 437/60 |
| 5,536,579 A | | 7/1996 | Davis et al. .................. 428/421 |
| 5,766,497 A | * | 6/1998 | Mitwalsky et al. .................. 216/56 |
| 5,841,099 A | * | 11/1998 | Owen et al. .................. 219/121.69 |

* cited by examiner

Primary Examiner—Kamand Cuneo
Assistant Examiner—Scott B. Geyer

(57) ABSTRACT

Many integrated circuits require a multilayer structure which contains layer of an organic or polymeric material with a patterned metallic layer on it. Laser patterning has many favorable characteristics but it also damages the organic or polymeric material. A novel method is disclosed that makes possible laser patterning of conductive metal electrode deposited on top of an organic and/or polymeric material without significant ablation of the organic and/or polymeric material. The method can achieve higher patterning resolution, resulting in higher quality integrated circuits. The method is based on the application of a thin coating of an inexpensive anti-reflector deposited on top of the desired metal electrode which in turn lies on the organic and/or polymeric material. The thin anti-reflecting coating allows the use of a lower fluence laser for ablation of metal layer without damaging the underlying organic and/or polymeric material.

16 Claims, 5 Drawing Sheets

MULTILAYER MICROSTRUCTURES AND LASER BASED METHOD FOR PRECISION AND REDUCED DAMAGE PATTERNING OF SUCH STRUCTURES

This application claims priority form U.S. patent application Ser. No. 60/284,197 filed Apr. 18, 2001.

FIELD OF THE INVENTION

The invention resides in the field of direct laser ablation of material. In particular, it relates to laser patterning of layers in the manufacturing of integrated semiconductor circuits and to such circuits made thereby. In more specific applications, the invention is a technique of patterning a metallic layer on an organic sublayer with minimal ablation or damage due to melt and/or carbonization of the underlying organic sublayer during processing of the metallic layer.

BACKGROUND OF THE INVENTION

Manufacture of integrated circuits involves deposition of a layer or layers on a substrate and etching parts of the layer or layers in desired patterns. Often these steps are repeated to produce a stacked structure. A variety of materials are used as layers and equally a variety of etching techniques are used for production of desired patterns. Cured laser etching or patterning is gaining wide acceptance in the field of IC (integrated circuits) manufacture.

The demand for low-cost and lower power small displays, digital projection and other personalized applications, has created a steady growing interest in organic light emitting materials that can be deposited using relatively inexpensive processes, such as spin-coating. However, organic materials are extremely sensitive to environmental conditions such as oxygen and moisture and to the chemical treatment used in the processing of photosensitive resins. As a result, pattering of organic-based devices cannot be easily realized with conventional methods of micro-fabrication since all-dry etching processing is required.

Shadow-masking is popular for the manufacture of organic light emitting diode (OLED) displays and can be applied to the fabrication of other organic electronics or photonics, but its lateral resolution is limited to ~100 $\mu$m. In addition, the shadow masking method requires sophisticated vacuum-compatible alignment tools. Laser ablation has the potential to attain much higher resolution at significantly lower cost.

In order to manufacture these compact displays, there is a strong demand for the ability to pattern multilayer microstructures with the high vertical resolution with special attention to confining the patterning process within an individual layer. Direct laser etching Is an all-dry etching processing suited for patterning and by using a short wavelength, a laser beam can be made to ablate materials with a high vertical resolution. The standard methods of laser patterning, however have one shortcoming. They fail to meet the requirement of operating below an ablation damage threshold for certain cases, that is to say, the etching process should not damage the underlying layer. The ablation damage threshold of a material is a threshold of a laser fluence above which the laser beam damages the structure of the material. The damages are generally in the form of carbonized organic material which may cause short circuits. In manufacture of certain ICs, the ablation damage threshold for the structure located in an underlying layer is often below that for the top layer. For example a structure consisting of th metallic thin film deposited on top of an organic material presents a typical case where traditional laser patterning does not produce satisfactory results. More specifically, ablation of an organic material with excessive laser energy, in addition to the deterioration of lateral resolution in patterning, can lead to material carbonization. A carbonized layer of organics is responsible for electrical short-cutting between the edges of ablated metallic film.

U.S. Pat. No. 4,490,211 Dec. 25, 1984 Chen et al discloses a laser induced chemical etching of metals with excimer lasers. According to the patent, a metalized substrate is exposed to a selected gas, e.g., a halogen gas, which spontaneously reacts with the metal forming a solid reaction product layer on the metal by a partial consumption of the metal. A pulsed beam of radiation is then applied from an excimer laser to the reaction product in a desired pattern. The laser radation has a wavelength which can be absorbed by the reaction product. Whenever the excimer laser radiation strikes, due to heating caused by absorption of the radation, the thin layer of reaction product is vaporized and driven off exposing a fresh layer of metal. A new layer of reaction product is formed on the freshly exposed metal, as before, by reacting the metal with the gas. This new layer of reaction product, in turn, is removed by irradiating with a pulse of laser radiation. In this manner, the metal is etched with a high resolution. The reaction product of copper chloride and several excimer lasers with different wavelengths are described in the patent. The patent describes this etching technique in connection with manufacturing of ICs using a silicon substrate. There are no organic layers in the structure described in the patent and no consideration is given to ablation damages to any layers. This method also requires a halogen gas atmosphere.

U.S. Pat. No. 5,536,579 Jul. 16, 1996 Davis et al discloses a method of manufacturing a multilayer electronic circuit utilizing two organic layers having varying optical absorbencies to applied laser light, wherein a first organic polymeric dielectric material has a first optical absorbency to an ablating wavelength of laser light, and a second organic polymeric dielectric material has a second optical absorbency to the ablating wavelength of laser light. A first layer of the first or the second organic polymeric materials overlays at least one surface of the at least one electrically conductive plane and a second layer of the other of the first and second organic polymeric materials overlays the first layer. With this multilayer structure, a laser beam only ablates the top layer, thus creating a blind hole without damaging an underlaying layer. The patent, however, describes drilling a blind hole through one of the two organic layers and it does not describe patterning the metal layer. Patterning of metallic layer without damaging the underlying organic layer cannot be achieved using this method.

U.S. Pat. No. 5,514,618 May 7, 1996 Hunter, Jr. et al describes a process for manufacture of flat panel liquid crystal display using direct laser etch. According to the patent, all the patterning of the display is done preferably by deposition followed by direct laser ablation. In the patent, patterned direct laser ablation of metals are described to form different components of the displays. The laser ablation is conducted on a metal layer lying over either another metal layer, polysilicon layer or a glass substrate. The patent mentions no organic layers upon which a metal layer to be ablated is provided.

Patterning of devices that comprise organic materials requires all-dry-etching processes, or sophisticated methods of thin film deposition, such as the separator technique, that would make possible a laterally selective deposition of the anode (cathode) material. Conventional methods of patterning are not suitable for application to organic materials because of technological steps that involve wet processing. In addition, the processing of organic materials with energetic ions in a dry etching chamber results in damage induced to the fragile chemical structure of such materials, which may reduce the fluorescence efficiency, affect electrical conductivity of the layer and lead to a catastrophic failure of a device so manufactured due to short circuit.

It is therefore an object of this invention to provide a method of patterning multilayer microstructures with special attention to confining the patterning process within an individual layer such that patterning of conductive metal electrodes deposited on top of an organic material is possible without significant ablation of the organic material in the underlying layer.

SUMMARY OF THE INVENTION

In one aspect, the invention relates to a method of ablating a layer of a material having an ablation damage threshold by a laser beam. The method includes steps of providing a source of laser beam having a specific Wavelength; depositing a coating of anti-reflector on the of layer material for preventing the laser beam form reflecting back, and in a single step, ablating the coating of an anti-reflector and the layer of material with the laser beam having a fluence lower than the ablation damage threshold of the layer of material, whereby an underlying layer having a lower damage threshold is undamaged.

In accordance with another aspect, the invention is directed to a method of direct laser patterning a multilayer microstructure having at least two layers of different materials, the material in a top layer having a higher ablation damage threshold than that of the remaining layers. The method includes steps of depositing a coating of an anti-reflector on the top layer and ablating the top layer through the coating of the anti-reflector, using the laser beam whose fluence is below the ablation damage threshold of the material located below the top layer.

In accordance with yet another aspect, the invention is directed to a multilayered integrated circuit which includes a layered structure of one or more organic and/or polymeric materials, a patterned metallic layer on the layered structure and a thin coating of an antireflecting material on the patterned metallic layer.

In accordance with the invention there is provided a method of laser patterning a conductive metal electrode having a higher ablation damage threshold deposited on a substrate material having a lower ablation damage threshold. The method includes steps of depositing a thin coating of an anti-reflector on the conductive metal electrode; and ablating the conductive metal electrode using the laser without damaging the underlying material layer.

In accordance with another aspect of the invention there is provided a method of laser patterning a conductive metal electrode layer having a higher ablation damage threshold deposited on a substrate material having a lower ablation damage threshold. The method comprises steps of depositing an absorption enhancing coating of Ag on the metal electorde layer and ablating in a desired pattern the conductive metal electrode layer by a laser beam of a specific wavelength and fluence.

In accordance with still another aspect, the method of the invention is for a direct laser patterning of a multilayer microstructure having at least two layers of different materials, the material in a top layer having a higher ablation damage threshold than that of the remaining layers the method includes steps of depositing a coating of an anti-reflector on the top layer and ablating the top layer through the coating of the anti-reflector, using the laser beam whose fluence is lower than the ablation damage threshold of the material of the top layer.

In accordance with a further aspect, the invention is directed to a multilayered integrated circuit which comprises a substrate, a layered structure of one or more organic and/or polymeric materials on the substrate, the material having a first ablation damage threshold. The multilayered integrated circuit further comprises a first patterned layer of a metal on the layered structure, the metal having a second ablation damage threshold, the second ablation damage threshold higher than the first ablation damage threshold, and a coating of an anti-reflecting material on the first patterned layer which enhances coupling of a laser light with the patterned layer.

DETAILED DESCRIPTION OF PREFERRED EMBODIMENTS OF THE INVENTION

Among many possible ways, an increased level of the vertical resolution in the laser-based patterning is achieved by applying laser beams of very short wavelengths, e.g. 193 or 157 nm. At these wavelengths the beam absorption depth is drastically reduced and the ablation process is confined to a shallow depth. Improvements to the method are achieved by applying sophisticated methods for in-situ monitoring of the ablation process.

The deposition methods to achieve patterned structures, such as the separator technique, have not been commercially established, they are complicated, thus potentially they will be expensive. The use of shorter laser wavelengths (193 or 157 nm) for patterning requires a special processing environment due to the strong absorption of these wavelengths in air, and in case of 157 nm the vacuum-processing environment is required. This results in high processing costs, especially if patterning is carried out for large size wafers.

Figure 1:
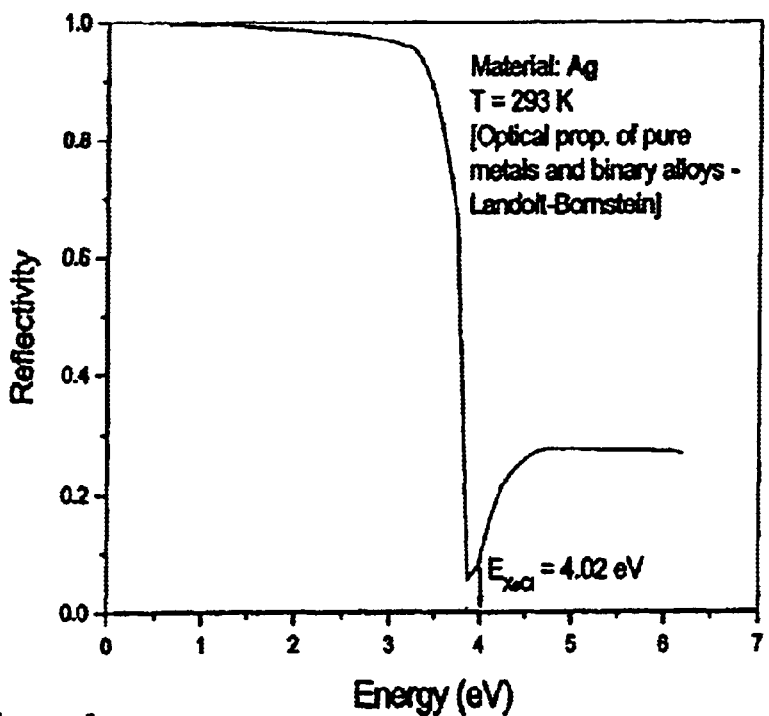
FIG. 1 is a curve showing the reflectivity coefficient of silver in relation to the energy of laser beam.
Figure 2:
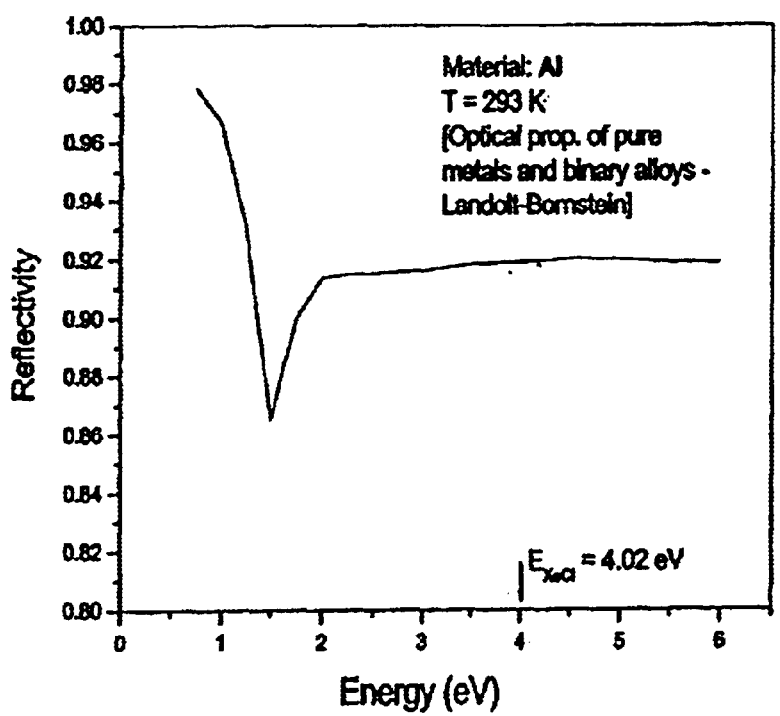
FIG. 2 is a curve showing the reflectivity coefficient of aluminum in relation to the energy of laser beam.

Applying a laser-based patterning technology in combination with a special low- or anti-reflection layer deposited on top of the workpiece dramatically enhances the coupling of the laser beam with the processed surface of the workpiece. This results in a large reduction of the requirement for the level of the laser fluence. A method that makes possible laser patterning of conductive metal electrode deposited on top of an organic material without significant ablation of the organic material is based on the application of a thin layer of an inexpensive anti- (or low) reflector deposited on top of the desired metal electrode. In case of a XeCl excimer laser that operates at λ=308 nm ($E_{XeCl}$=4.02 eV), this can be achieved with a thin layer of Ag (silver) as an anti-reflector on top of an electrode layer of aluminum. FIGS. 1 and 2 are relationship curves between reflectivity coefficient and energy of laser beam at wavelength of λ=308 nm. As seen in the figures, for such wavelength, silver's reflectivity coefficient is about R=0.08, which compares with R=0.92 for Al (aluminum). Al is a material which is frequently used as a cathode for passive matrix organic devices. Other materials with large difference in reflectivity to a specific wavelength of a laser beam can be used for this purpose, provided other characteristics are favourable, e.g., electrical conductivity, resistivity, ease of applying coatings, etc.

Figure 3:
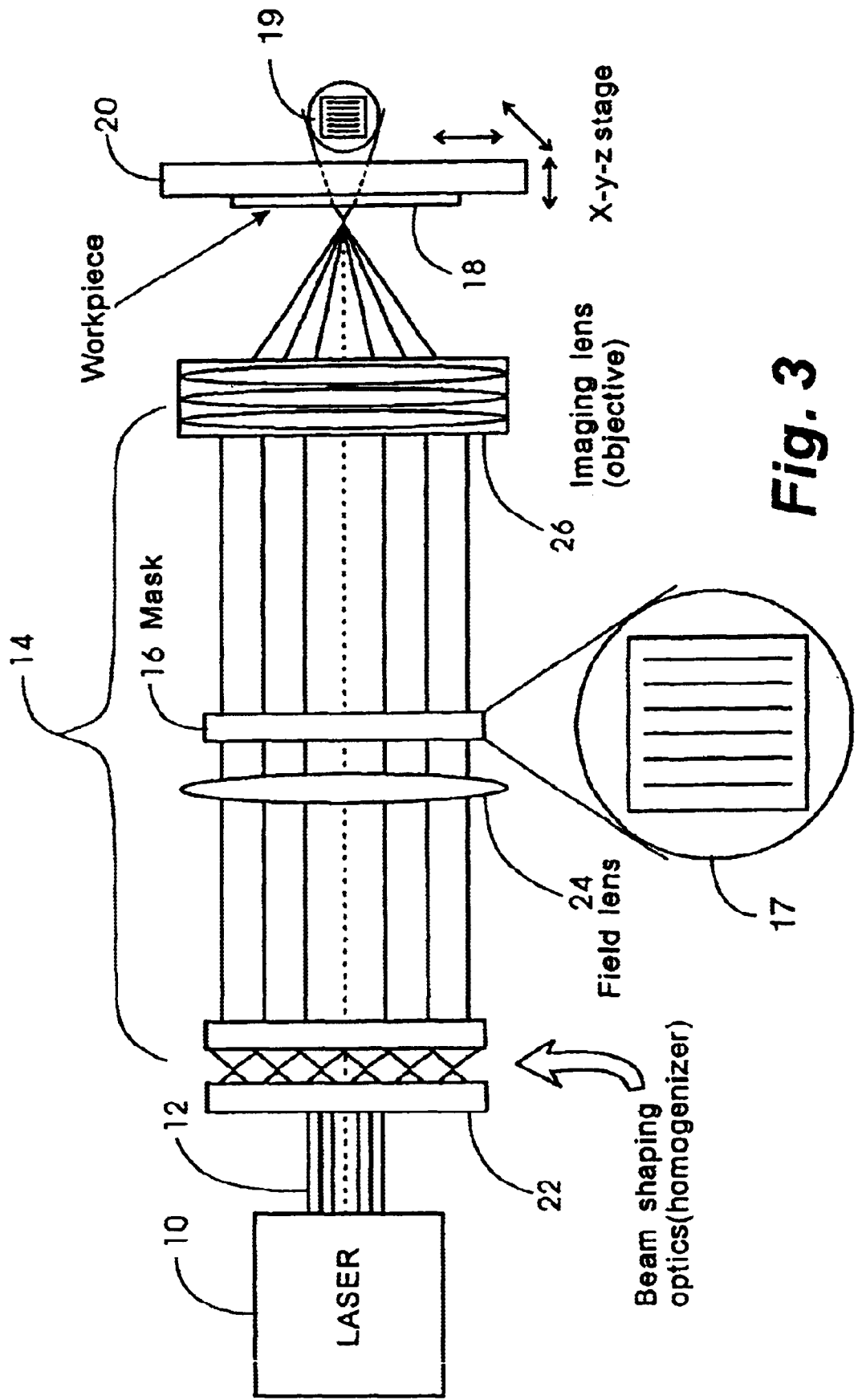
FIG. 3 shows schematically a set-up of direct laser ablation according to one embedment of the invention.

FIG. 3 shows schematically a set-up of a direct laser etching technique according to one embodiment of the invention, being used for manufacture of a high-resolution flat panel organic light-emitting diode (OLEO) display element. In the figure, a XeCl excimer laser source 10 produces a beam of radiation 12 having a wavelength of 308 nm. An optical system 14 shapes the beam and focuses an image of a mask 16 on to a workpeice 18 located on an X-Y-Z platform 20. Planar views of the mask and workpiece are shown at 17 and 19. The optical system is shown to include a beam shaping optics (homogenizer) 22, a field lens 24 and an imaging lens (objective) 26, any optical arrangements which project a beam of radiation, patterned by a mask, onto a workplace can be used.

Figure 4:
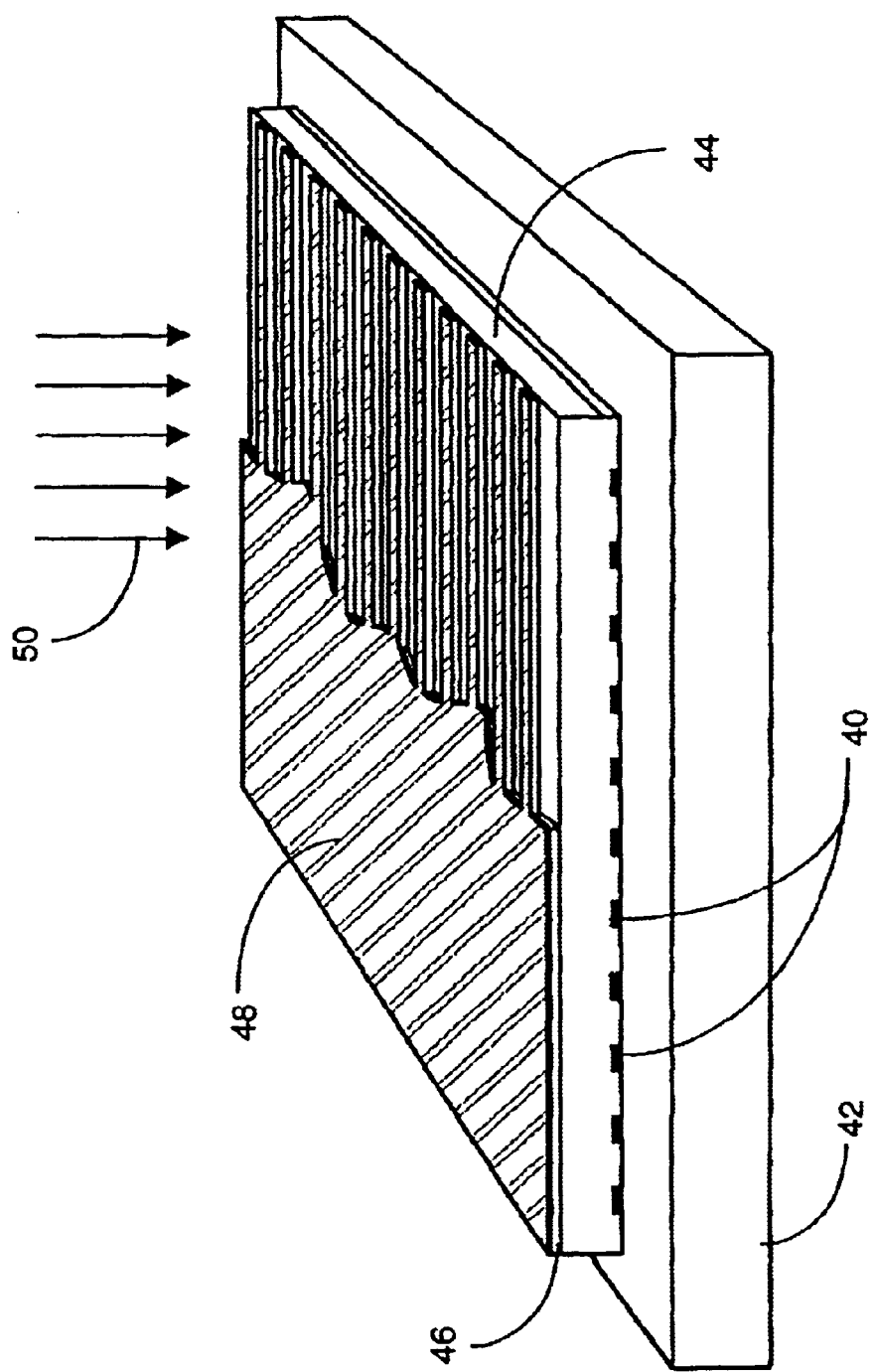
FIG. 4 shows schematically a workpiece being processed.

FIG. 4 shows a cutaway of a workpiece being processed. It should, however, be noted that the figure is not a true representation of a process as the laser ablation can be performed in 2D, 1D scanning or scanning by a tightly focused beam. In the figure, the first set of transparent or semitransparent electrodes 40 of a specific pattern (e.g., a plurality of parallel thin electrodes) are made of thin film of indium tin oxide (ITO) or gold (Au) on a substrate 42, e.g., glass plate. These electrodes can be patterned by the dry laser etching of the present invention but they can also be patterened by any known processes as no organic layer is present during this process. An OLED 44 is provided on the layer of electrodes. These electrodes act as the anode in the OLED device, which generates light or changes its optical characteristics when an electrical potential is applied across it. A typical OLED structure consists of a hole transport layer, such as N,N'-diphenyl-N,N'-bis(3-methylphenyl) benzadine (TPD), deposited on the semitransparent anode and an electrode transport/emitter layer, such as 8-hydroxyquinoline aluminum ($Alq_3$). $Alq_3$ is deposited on top of TPD, and an aluminum layer (cathode) 46 is then deposited on the $Alq_3$ layer of organic material. Other organic or polymeric materials with similar characteristics such as liquid crystals, etc., can be processed to manufacture optoelectric devices. The cathode (Al) is covered with a coating 48 of a material which exhibits an anti-reflection of low reflection characteristic to the wavelength of the excimer laser 50 being used. An example of such materials for the wavelength of 308 nm is silver. The laser beam projects a pattern of the mask onto the silver coating of the workpiece. The fluence of the laser beam is set to a level that is lower than the ablation damage threshold of aluminum. Because there is no or very little reflection of the laser radiation form the top coating of Ag, sufficient laser energy is coupled to the underlying aluminum electrode layer to ablate it. Because of the presence of the anti-reflection layer, the laser fluence needed to ablate the aluminum layer can be adjusted to a much lower level, resulting in decrease or elimination of ablation damage in the underlying organic layer.

In another embodiment, multiple stacks of these layers can be fabricated in stages. During each stage of direct laser dry etching, an anti-reflection coating is applied to the workpiece to ensure that underlying organic layer is not damaged.

The laser patterning method is used for achieving high-definition patterning of materials (layers) with relatively high-threshold for ablation, such as metal electrodes deposited on top of materials (layers) with low-threshold for ablation.

Advantageously, due to the reduced fluence requirements for patterning of the top layer material the chances for introducing extensive damage to the structure located below are significantly reduced. At the same time, reduced or no damages in the organic material achieve higher patterning resolution in lateral plane, resulting in more compact or more densely packed ICs.

Advantageously with this approach used in one embodiment, the Ag-coated Al layer can be patterned with significantly reduced laser fluence as compared to the laser fluence required for direct patterning of Al. The Ag layer also acts as a conducting layer deposited on top of the Al layer.

Figure 6:
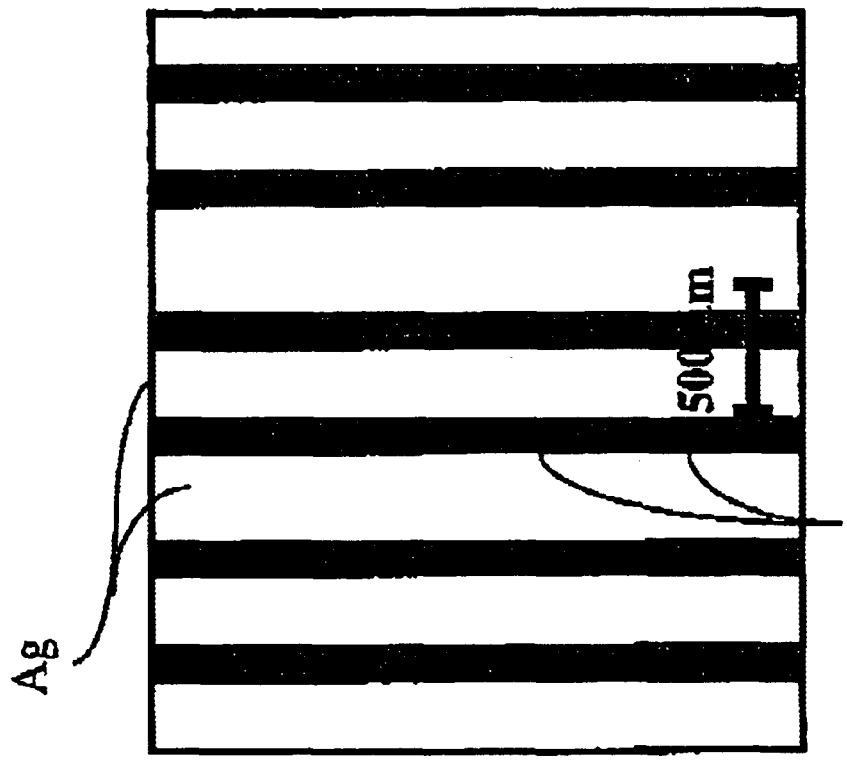
FIG. 6 is a planar view of the structure of FIG. 5.
Figure 5:
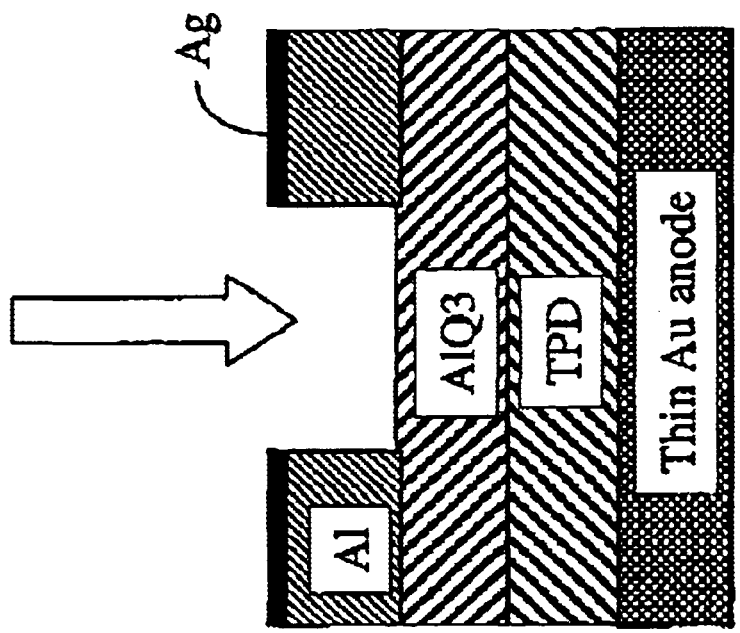
FIG. 5 is a cross section of a multilayered structure made according to the present invention.

FIG. 5 shows an example of a test Ag/Al/Alq/TPD/Au structure patterned with the 308 nm laser. It comprises an array of Au electrodes (anodes) deposited on a glass substrate. Theses Au electrodes were patterned as a plurality of parallel electrodes on the substrate by conventional lithography. A pair of TPD and $Alq_3$ layers were deposited on Au anodes and covered with a ~100 nm thick layer of Al and a 20 nm thick layer of Ag. A series of ~100*/μm wide cuts were obtained (only one is shown) by low-resolution projection of a rectangular shape pattern on the sample that was simultaneously translated in one direction at the right angle to the direction of the Au electrodes. The translation produces parallel cuts as shown in FIG. 6 in which the cuts are shown as dark vertical bands of about 100 μm wide at less than 500 μm apart. The Au electrodes are an array of a plurality of horizontal electrodes. Following the patterning process, parts of the array of Au electrodes have been revealed at the bottom of laser etched cuts. This device is free from the carbonized organic material that is usually formed under the irradiation with excessive laser fluence.

Figure 9:
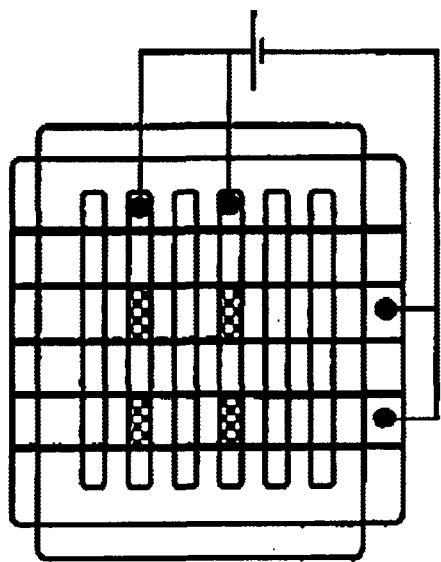
FIG. 9 show four devices are activated, indicating that the devices can be addressed individually.
Figure 8:
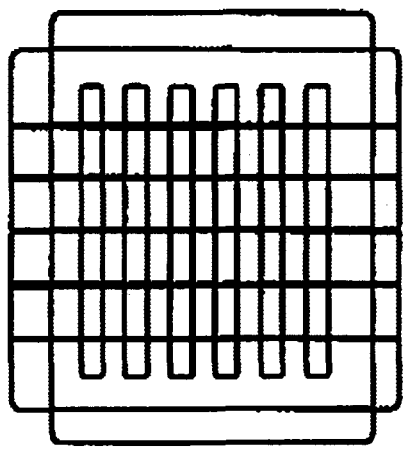
FIG. 8 show laser patterned OLEDs.
Figure 7:
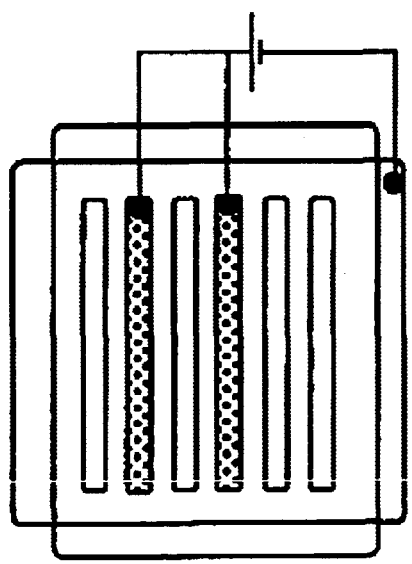
FIG. 7 show OLED strips before patterning.

An example of an OLED device that was patterned with the method described in this document is shown in FIGS. 7–9. It uses ITO as an anode and consists of an array of 6 devices, each about 2.0 mm×30 mm, which emits simultaneously upon biasing as seen in FIG. 7. By laser patterning (by forming 5 vertical cuts), an array of 36 devices was fabricated. The patterning process did not compromise the performance of this structure and each of these 36 devices could emit light as indicated in FIG. 8, by addressing them individually. An example of a simultaneous emission from 4 devices that were selectively biased is shown in FIG. 9.

Numerous other embodiments may be envisioned without departing from the spirit or scope of the invention.

What is claimed is:

1. A method of ablating layer of material having an ablation damage threshold by laser beam, comprising steps of:

providing a source of laser beam having a specific wavelength;

depositing a coating of an anti-reflector on the layer of material for preventing the laser beam from reflecting back, and ablating the coating of the anti-reflector and the layer of material with the laser beam having a fluence lower than the ablation damage threshold of the layer of material, whereby an underlying layer having a lower damage threshold is undamaged.

2. The method of ablating a layer material, according to claim 1, wherein the layer of material is in a multilayer structure of different materials, the materials having different ablation damage thresholds.

3. The method of ablating a layer of material, according to claim 2, wherein the underlying layer is in multilayer structure of different materials.

4. A method of direct laser patterning a multilayer microstructure having at least two layers of different materials, the material in a top layer having a higher ablation damage threshold than that of the remaining layers, comprising steps of:

depositing a coating of an anti-reflector on the top layer, and ablating the top layer through the coating of anti-reflector, using the laser beam whose fluence is lower than the ablation damage threshold of the material of the top layer.

5. The method according to claim 4, wherein the multilayer microstructure is a display element having metal electrodes in the top layer and an opto-organic material in one of the remaining layers, the method further comprising steps of:

depositing a coating of silver on the top layer, and patterning with a laser beam the top layer through the layer of silver to form the metal electrodes, the laser beam having a specific wavelength and a fluence lower than an ablation damage threshold of the opto-organic material.

6. The method according to claim 5, wherein the metal electrodes are made of aluminum and the laser beam is from an XeCl excimer laser at 308 nm of wavelength.

7. The method according to claim 6, wherein the opto-organic material is any of a light emitting organic material, polymeric material and a liquid crystal.

8. The method according to claim 7, wherein the opto-organic material is TPD and $Alq_3$.

9. The method according to claim 5, wherein the patterning the top layer is performed by using a patterned mask.

10. The method according to claim 5, wherein the patterning the top layer is performed by a step of:

imparting a lateral movement between the laser beam and the conductive metal electrode which ablating.

11. A method of laser patterning a conductive metal electrode having a higher ablation threshold deposited on a substrate material having a lower ablation threshold comprising steps of:

depositing a thin coating of an anti-reflector on the conductive metal electrode, and ablating the conductive metal electrode using a laser beam with fluence which represents substantially no damages in the underlying substrate material.

12. The method of laser patterning a conductive metal electrode according to claim 11, further comprising the steps of:

providing a source of laser beam at a wavelength so that the thin coating of anti-reflector enhances coupling of the laser beam with the conductive metal electrode by preventing the laser beam from reflecting back, and ablating the conductive metal electrode using the laser beam having a fluence below the higher ablation threshold.

13. The method of laser patterning a conductive metal electrode according to claim 12, further comprising a step of:

ablating the conductive metal electrode using the laser beam having a fluence below the lower ablation threshold.

14. The method of laser patterning a conductive metal electrode according to claim 11, further comprising a step of:

ablating the conductive metal electrode by using projection lithography and a patterned mask.

15. The method of laser patterning a conductive metal electrode according to claim 11, further comprising a step of:

imparting a lateral movement between the laser beam and the conductive metal electrode which ablating.

16. A method of ablating a layer of material in a composite, the composite including the layer of material and an underlying layer, comprising steps of:

providing a source of laser beam having a specific wavelength;

depositing a coating of an anti-reflector on the layer of material for preventing the laser beam from reflecting back, and ablating the coating of the anti-reflector and the layer of material with the laser beam having a fluence lower than the ablation damage threshold of the layer of material, whereby the underlying layer having a lower damage threshold is undamaged.

* * * * *